United States Patent
Mullee et al.

(10) Patent No.: US 7,064,070 B2
(45) Date of Patent: Jun. 20, 2006

(54) REMOVAL OF CMP AND POST-CMP RESIDUE FROM SEMICONDUCTORS USING SUPERCRITICAL CARBON DIOXIDE PROCESS

(75) Inventors: William H. Mullee, Portland, OR (US); Marc de Leeuwe, Templeton, CA (US); Glenn A. Roberson, Jr., Hollister, CA (US); Bentley J. Palmer, Phoenix, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/396,612

(22) Filed: Mar. 24, 2003

(65) Prior Publication Data

US 2004/0142564 A1    Jul. 22, 2004

Related U.S. Application Data

(63) Continuation-in-part of application No. 10/042,486, filed on Oct. 18, 2001, now Pat. No. 6,537,916, which is a continuation of application No. 09/796,300, filed on Feb. 27, 2001, now Pat. No. 6,331,487, which is a continuation of application No. 09/407,628, filed on Sep. 28, 1999, now Pat. No. 6,277,753.

(60) Provisional application No. 60/101,988, filed on Sep. 28, 1998.

(51) Int. Cl.
*H01L 21/302* (2006.01)

(52) U.S. Cl. .................. 438/691; 438/692; 438/693; 134/1.2; 134/1.3

(58) Field of Classification Search ............. 438/691, 438/692, 693; 134/1.1, 1.2, 2, 26, 31, 1.3, 134/263

See application file for complete search history.

(56) References Cited

U.S. PATENT DOCUMENTS

| | | |
|---|---|---|
| 2,439,689 A | 4/1948 | Hyde et al. |
| 2,617,719 A | 11/1952 | Stewart |
| 2,993,449 A | 7/1961 | Harland ............. 103/87 |
| 3,135,211 A | 6/1964 | Pezzillo ............. 103/87 |
| 3,642,020 A | 2/1972 | Payne |
| 3,890,176 A | 6/1975 | Bolon |
| 3,900,551 A | 8/1975 | Bardoncelli et al. |
| 4,219,333 A | 8/1980 | Harris |
| 4,341,592 A | 7/1982 | Shortes et al. |
| 4,349,415 A | 9/1982 | DeFilippi et al. |
| 4,475,993 A | 10/1984 | Blander et al. |
| 4,749,440 A | 6/1988 | Blackwood et al. |
| 4,838,476 A | 6/1989 | Rahn |
| 4,877,530 A | 10/1989 | Moses |
| 4,879,004 A | 11/1989 | Oesch et al. |
| 4,923,828 A | 5/1990 | Gluck et al. |
| 4,925,790 A | 5/1990 | Blanch et al. |

(Continued)

FOREIGN PATENT DOCUMENTS

WO     WO 01/33613 A2     5/2001

OTHER PUBLICATIONS

US 6,001,133, 12/1999, DeYoung et al. (withdrawn)
US 6,486,282, 11/2002, Dammel et al. (withdrawn)

*Primary Examiner*—Lan Vinh
(74) *Attorney, Agent, or Firm*—Haverstock & Owens LLP

(57) ABSTRACT

A method of post chemical mechanical polishing (CMP) cleaning to remove a CMP residue from a surface of an object is disclosed. The object is placed within a pressure chamber. The pressure chamber is pressurized. A supercritical carbon dioxide process is performed to remove a residual CMP residue from the surface of the object. The pressure chamber is vented.

20 Claims, 3 Drawing Sheets

U.S. PATENT DOCUMENTS

| | | | |
|---|---|---|---|
| 4,933,404 A | 6/1990 | Beckman et al. | |
| 4,944,837 A * | 7/1990 | Nishikawa et al. | 216/41 |
| 5,011,542 A | 4/1991 | Weil | |
| 5,013,366 A | 5/1991 | Jackson et al. | |
| 5,068,040 A | 11/1991 | Jackson | |
| 5,071,485 A | 12/1991 | Matthews et al. | |
| 5,091,207 A | 2/1992 | Tanaka | |
| 5,105,556 A | 4/1992 | Kurokawa et al. | |
| 5,158,704 A | 10/1992 | Fulton et al. | |
| 5,174,917 A | 12/1992 | Monzyk | |
| 5,185,058 A | 2/1993 | Cathey, Jr. | |
| 5,185,296 A | 2/1993 | Morita et al. | |
| 5,196,134 A | 3/1993 | Jackson | |
| 5,201,960 A | 4/1993 | Starov | |
| 5,213,619 A | 5/1993 | Jackson et al. | |
| 5,215,592 A | 6/1993 | Jackson | |
| 5,225,173 A | 7/1993 | Wai | |
| 5,236,602 A | 8/1993 | Jackson | |
| 5,237,824 A | 8/1993 | Pawliszyn | |
| 5,238,671 A | 8/1993 | Matson et al. | |
| 5,250,078 A | 10/1993 | Saus et al. | |
| 5,261,965 A | 11/1993 | Moslehi | |
| 5,266,205 A | 11/1993 | Fulton et al. | |
| 5,269,815 A | 12/1993 | Schlenker et al. | |
| 5,269,850 A | 12/1993 | Jackson | |
| 5,274,129 A | 12/1993 | Natale et al. | |
| 5,285,352 A | 2/1994 | Pastore et al. | |
| 5,288,333 A | 2/1994 | Tanaka et al. | |
| 5,290,361 A | 3/1994 | Hayashida et al. | |
| 5,294,261 A | 3/1994 | McDermott et al. | |
| 5,298,032 A | 3/1994 | Schlenker et al. | |
| 5,304,515 A | 4/1994 | Morita et al. | |
| 5,306,350 A | 4/1994 | Hoy et al. | |
| 5,312,882 A | 5/1994 | DeSimone et al. | |
| 5,314,574 A | 5/1994 | Takahashi | |
| 5,316,591 A | 5/1994 | Chao et al. | |
| 5,320,742 A | 6/1994 | Fletcher et al. | |
| 5,328,722 A | 7/1994 | Ghanayem et al. | |
| 5,334,332 A | 8/1994 | Lee | |
| 5,334,493 A | 8/1994 | Fujita et al. | |
| 5,352,327 A | 10/1994 | Witowski | |
| 5,356,538 A | 10/1994 | Wai et al. | |
| 5,364,497 A | 11/1994 | Chau et al. | |
| 5,370,740 A | 12/1994 | Chao et al. | |
| 5,370,741 A | 12/1994 | Bergman | |
| 5,370,742 A | 12/1994 | Mitchell et al. | |
| 5,397,220 A | 3/1995 | Akihisa et al. | 417/369 |
| 5,401,322 A | 3/1995 | Marshall | |
| 5,403,621 A | 4/1995 | Jackson et al. | |
| 5,403,665 A | 4/1995 | Alley et al. | |
| 5,417,768 A | 5/1995 | Smith, Jr. et al. | |
| 5,456,759 A | 10/1995 | Stanford, Jr. et al. | |
| 5,470,393 A | 11/1995 | Fukazawa | |
| 5,474,812 A | 12/1995 | Truckenmuller et al. | |
| 5,482,564 A | 1/1996 | Douglas et al. | |
| 5,486,212 A | 1/1996 | Mitchell et al. | |
| 5,494,526 A | 2/1996 | Paranjpe | |
| 5,500,081 A | 3/1996 | Bergman | |
| 5,501,761 A | 3/1996 | Evans et al. | |
| 5,514,220 A | 5/1996 | Wetmore et al. | |
| 5,522,938 A | 6/1996 | O'Brien | |
| 5,547,774 A | 8/1996 | Gimzewski et al. | |
| 5,550,211 A | 8/1996 | DeCrosta et al. | |
| 5,580,846 A | 12/1996 | Hayashida et al. | |
| 5,589,082 A | 12/1996 | Lin et al. | |
| 5,589,105 A | 12/1996 | DeSimone et al. | |
| 5,629,918 A | 5/1997 | Ho et al. | |
| 5,632,847 A | 5/1997 | Ohno et al. | |
| 5,635,463 A | 6/1997 | Muraoka | |
| 5,637,151 A | 6/1997 | Schulz | |
| 5,641,887 A | 6/1997 | Beckman et al. | |
| 5,656,097 A | 8/1997 | Olesen et al. | |
| 5,665,527 A | 9/1997 | Allen et al. | |
| 5,676,705 A | 10/1997 | Jureller et al. | |
| 5,679,169 A * | 10/1997 | Gonzales et al. | 134/1.3 |
| 5,679,171 A | 10/1997 | Saga et al. | |
| 5,683,473 A | 11/1997 | Jureller et al. | |
| 5,683,977 A | 11/1997 | Jureller et al. | |
| 5,688,879 A | 11/1997 | DeSimone | |
| 5,700,379 A | 12/1997 | Biebl | |
| 5,714,299 A | 2/1998 | Combes et al. | |
| 5,725,987 A | 3/1998 | Combes et al. | |
| 5,726,211 A | 3/1998 | Hedrick et al. | |
| 5,730,874 A | 3/1998 | Wai et al. | |
| 5,736,425 A | 4/1998 | Smith et al. | |
| 5,739,223 A | 4/1998 | DeSimone | |
| 5,766,367 A | 6/1998 | Smith et al. | |
| 5,783,082 A | 7/1998 | DeSimone et al. | |
| 5,797,719 A | 8/1998 | James et al. | |
| 5,798,438 A | 8/1998 | Sawan et al. | |
| 5,804,607 A | 9/1998 | Hedrick et al. | |
| 5,807,607 A | 9/1998 | Smith et al. | |
| 5,847,443 A | 12/1998 | Cho et al. | |
| 5,866,005 A | 2/1999 | DeSimone et al. | |
| 5,868,856 A | 2/1999 | Douglas et al. | |
| 5,868,862 A | 2/1999 | Douglas et al. | |
| 5,872,061 A | 2/1999 | Lee et al. | |
| 5,872,257 A | 2/1999 | Beckman et al. | |
| 5,873,948 A | 2/1999 | Kim | |
| 5,881,577 A | 3/1999 | Sauer et al. | |
| 5,888,050 A | 3/1999 | Fitzgerald et al. | |
| 5,893,756 A | 4/1999 | Berman et al. | |
| 5,896,870 A | 4/1999 | Huynh et al. | |
| 5,900,354 A | 5/1999 | Batchelder | |
| 5,904,737 A | 5/1999 | Preston et al. | |
| 5,908,510 A | 6/1999 | McCullough et al. | |
| 5,928,389 A | 7/1999 | Jevtic | |
| 5,932,100 A | 8/1999 | Yager et al. | |
| 5,944,996 A | 8/1999 | DeSimone et al. | |
| 5,955,140 A | 9/1999 | Smith et al. | |
| 5,965,025 A | 10/1999 | Wai et al. | |
| 5,976,264 A | 11/1999 | McCullough et al. | |
| 5,980,648 A | 11/1999 | Adler | |
| 5,992,680 A | 11/1999 | Smith | |
| 5,994,696 A | 11/1999 | Tai et al. | |
| 6,005,226 A | 12/1999 | Aschner et al. | |
| 6,017,820 A | 1/2000 | Ting et al. | |
| 6,021,791 A * | 2/2000 | Dryer et al. | 134/100.1 |
| 6,024,801 A | 2/2000 | Wallace et al. | |
| 6,037,277 A | 3/2000 | Masakara et al. | |
| 6,063,714 A | 5/2000 | Smith et al. | |
| 6,067,728 A | 5/2000 | Farmer et al. | |
| 6,099,619 A | 8/2000 | Lansbarkis et al. | |
| 6,100,198 A | 8/2000 | Grieger et al. | |
| 6,110,232 A | 8/2000 | Chen et al. | |
| 6,114,044 A | 9/2000 | Houston et al. | |
| 6,128,830 A | 10/2000 | Bettcher et al. | |
| 6,140,252 A | 10/2000 | Cho et al. | |
| 6,149,828 A | 11/2000 | Vaartstra | |
| 6,171,645 B1 | 1/2001 | Smith et al. | |
| 6,200,943 B1 | 3/2001 | Romack et al. | |
| 6,216,364 B1 | 4/2001 | Tanaka et al. | |
| 6,224,774 B1 | 5/2001 | DeSimone et al. | |
| 6,228,563 B1 | 5/2001 | Starov et al. | |
| 6,228,826 B1 | 5/2001 | DeYoung et al. | |
| 6,232,238 B1 | 5/2001 | Chang et al. | |
| 6,232,417 B1 | 5/2001 | Rhodes et al. | |
| 6,239,038 B1 | 5/2001 | Wen | |
| 6,242,165 B1 | 6/2001 | Vaartstra | |
| 6,251,250 B1 | 6/2001 | Keigler | |
| 6,255,732 B1 | 7/2001 | Yokoyama et al. | |
| 6,262,510 B1 | 7/2001 | Lungu | 310/254 |
| 6,270,531 B1 | 8/2001 | DeYoung et al. | |
| 6,270,948 B1 | 8/2001 | Sato et al. | |

| | | |
|---|---|---|
| 6,277,753 B1 | 8/2001 | Mullee et al. |
| 6,284,558 B1 | 9/2001 | Sakamoto |
| 6,286,231 B1 | 9/2001 | Bergman et al. |
| 6,306,564 B1 | 10/2001 | Mullee |
| 6,319,858 B1 | 11/2001 | Lee et al. |
| 6,331,487 B1 | 12/2001 | Koch |
| 6,333,268 B1 | 12/2001 | Starov et al. |
| 6,344,243 B1 | 2/2002 | McClain et al. |
| 6,358,673 B1 | 3/2002 | Namatsu |
| 6,361,696 B1 | 3/2002 | Spiegelman et al. |
| 6,367,491 B1 | 4/2002 | Marshall et al. |
| 6,380,105 B1 | 4/2002 | Smith et al. |
| 6,425,956 B1 | 7/2002 | Cotte et al. |
| 6,436,824 B1 | 8/2002 | Chooi et al. |
| 6,454,945 B1 | 9/2002 | Weigl et al. |
| 6,458,494 B1 | 10/2002 | Song et al. |
| 6,461,967 B1 | 10/2002 | Wu et al. |
| 6,465,403 B1 * | 10/2002 | Skee .......................... 510/175 |
| 6,485,895 B1 | 11/2002 | Choi et al. |
| 6,486,078 B1 | 11/2002 | Rangarajan et al. |
| 6,492,090 B1 | 12/2002 | Nishi et al. |
| 6,500,605 B1 | 12/2002 | Mullee et al. |
| 6,509,141 B1 * | 1/2003 | Mullee ....................... 430/329 |
| 6,537,916 B1 * | 3/2003 | Mullee et al. .............. 438/692 |
| 6,558,475 B1 | 5/2003 | Jur et al. |
| 6,562,146 B1 | 5/2003 | DeYoung et al. |
| 6,596,093 B1 | 7/2003 | DeYoung et al. |
| 6,635,565 B1 * | 10/2003 | Wu et al. ................... 438/637 |
| 6,641,678 B1 | 11/2003 | DeYoung et al. |
| 6,764,552 B1 | 7/2004 | Joyce et al. .................... 134/3 |
| 6,890,853 B1 | 5/2005 | Biberger et al. |
| 2001/0019857 A1 | 9/2001 | Yokoyama et al. |
| 2001/0024247 A1 | 9/2001 | Nakata |
| 2001/0041455 A1 | 11/2001 | Yun et al. |
| 2001/0041458 A1 | 11/2001 | Ikakura et al. |
| 2002/0001929 A1 | 1/2002 | Biberger et al. |
| 2002/0055323 A1 | 5/2002 | McClain et al. |
| 2002/0074289 A1 | 6/2002 | Sateria et al. |
| 2002/0081533 A1 | 6/2002 | Simons et al. |
| 2002/0088477 A1 | 7/2002 | Cotte et al. |
| 2002/0098680 A1 | 7/2002 | Goldstein et al. |
| 2002/0106867 A1 | 8/2002 | Yang et al. |
| 2002/0112740 A1 | 8/2002 | DeYoung et al. |
| 2002/0112746 A1 | 8/2002 | DeYoung et al. |
| 2002/0115022 A1 | 8/2002 | Messick et al. |
| 2002/0117391 A1 | 8/2002 | Beam |
| 2002/0123229 A1 | 9/2002 | Ono et al. |
| 2002/0127844 A1 | 9/2002 | Grill et al. |
| 2002/0132192 A1 | 9/2002 | Namatsu |
| 2002/0141925 A1 | 10/2002 | Wong et al. |
| 2002/0142595 A1 | 10/2002 | Chiou |
| 2002/0150522 A1 | 10/2002 | Heim et al. |
| 2002/0164873 A1 | 11/2002 | Masuda et al. ............. 438/689 |
| 2003/0003762 A1 | 1/2003 | Cotte et al. |
| 2003/0008238 A1 | 1/2003 | Goldfarb et al. |
| 2003/0008518 A1 | 1/2003 | Chang et al. |
| 2003/0013311 A1 | 1/2003 | Chang et al. |
| 2003/0036023 A1 | 2/2003 | Moreau et al. |
| 2003/0047533 A1 | 3/2003 | Reid et al. |
| 2003/0051741 A1 | 3/2003 | DeSimone et al. |
| 2003/0106573 A1 | 6/2003 | Masuda et al. ............... 134/26 |
| 2003/0125225 A1 | 7/2003 | Xu et al. ..................... 510/175 |
| 2003/0198895 A1 | 10/2003 | Toma et al. |
| 2003/0205510 A1 | 11/2003 | Jackson |
| 2003/0217764 A1 | 11/2003 | Masuda et al. ............... 134/26 |
| 2004/0011386 A1 | 1/2004 | Seghal |
| 2004/0020518 A1 | 2/2004 | DeYoung et al. |
| 2004/0087457 A1 | 5/2004 | Korzenski et al. .......... 510/177 |
| 2004/0103922 A1 | 6/2004 | Inoue et al. ................... 134/26 |
| 2004/0112409 A1 | 6/2004 | Schilling ....................... 134/26 |
| 2004/0134515 A1 | 7/2004 | Castrucci |
| 2004/0177867 A1 | 9/2004 | Schilling ....................... 134/26 |
| 2004/0259357 A1 | 12/2004 | Saga |

* cited by examiner

REMOVAL OF CMP AND POST-CMP RESIDUE FROM SEMICONDUCTORS USING SUPERCRITICAL CARBON DIOXIDE PROCESS

RELATED APPLICATIONS

This application is a continuation in part of co-pending U.S. patent application Ser. No. 10/042,486, filed on Oct. 18, 2001 now U.S. Pat. No. 6,537,916, which is a continuation of 09/796,300 filed Feb. 27, 2001 now issued U.S. Pat. No. 6,331,487 B2, which is a continuation of 09/407,628 filed Sep. 28, 1999 now issued U.S. Pat. No. 6,277,753 B1, which claims priority from U.S. Provisional Application No. 60/101,988, filed on Sep. 28, 1998, all of which are incorporated by reference.

FIELD OF THE INVENTION

The present invention relates to the field of removing chemical mechanical polishing (CMP) residue and contaminants such as trace metals from semiconductor wafers. More particularly, the present invention relates to the field of removing CMP residue and contaminants such as trace metals from semiconductor wafers using supercritical carbon dioxide.

BACKGROUND OF THE INVENTION

Chemical mechanical polishing (CMP) is an established semiconductor manufacturing process step. CMP has been widely employed in the manufacture of semiconductor devices to eliminate topographic variations and accomplish global planarization of wafer surfaces. Particulate surface contamination of semiconductor wafers after the CMP process is a serious problem that affects yield in the industry. Micrometer and sub-micrometer particle removal from the device feature surfaces is related to high productivity, low cost-of-ownership manufacturing. For more than 30 years the semiconductor industry has upheld Moore's Law, i.e., the theory that computational power will double every 18 months, largely because decreases in device feature sizes have produced increases in the operational speed of logic devices and corresponding reductions in production costs—and sustained the historical rate of cost reduction of new semiconductor products. Continued reduction in feature sizes has driven more stringent performance requirements for every step in the manufacture of integrated circuits, including the post-CMP cleaning step. Post-CMP cleaning is a process to minimize particles and other contaminants that come from various sources in the CMP process. In the semiconductor industry, during the early development of the CMP and cleaning processes, the two processes were evaluated independently of one another. Under the current paradigm, the CMP and post-CMP cleaning processes are inter-related and the performance of a post-CMP cleaning process is related to high productivity and low production costs.

When device feature sizes shrink to less than 0.18 μm, the complexity of interconnect structures becomes a significant factor affecting integrated circuit design and performance. As semiconductor device feature sizes decrease with advancing technologies, there is a need for effective post-CMP cleaning methods to remove CMP residue and reduce particulate contamination to acceptable levels, e.g., $<10^{13}$ atoms/cm$^2$.

In recent years, as the semiconductor industry approached the 180-nm technology node (Ref.: International Technology Roadmap for Semiconductors (ITRS) 1999, laying out a 15-year outlook for the industry), the performance limitations of aluminum and silicon interconnects presented challenges to industry efforts to sustain Moore's Law. In general, interconnection delays have been found to increase with the square of the reduction in feature size. As device geometries shrink, more emphasis must be placed on the interconnect structures to minimize resistance-capacitance time delays. One approach to minimizing interconnection delays has been to add more layers of metal. Adding more layers of metal, however, has the disadvantages of increasing production costs and generating additional heat, with adverse effect on device performance and reliability.

Strategies to minimize interconnect delays include improving conductivity and lowering the dielectric constant (k) value by employing low-k films. For example, copper (Cu) has emerged as a replacement for conventional aluminum (Al) as the interconnect metal in advanced devices. Copper has greater conductivity than aluminum (thus reducing resistance-capacitance time delays) and also is less subject to electromigration when compared to conventional Al metallization. The material properties of Cu present challenges to the CMP and post-CMP cleaning processes. One challenge in Cu CMP is minimizing the formation of micro-scratches (a common problem in CMP processes), which can degrade device performance. Copper is softer than other materials such as tungsten and thus scratches more easily. Other challenges include the problems of dishing, erosion, and thinning of Cu lines beyond the target thickness that can generate increased line resistance and resistance-capacitance time delays—all of which are due to the relative softness of Cu metal. There is a need for post-CMP cleaning methods to remove residual slurry particles (CMP slurry is a mix of liquids and abrasive powder) with complex compositions, pieces of polishing pad used in CMP, and copper contamination such as trace levels of Cu metal ions.

The adhesion of slurry particles and Cu metal ions to wafers is a problem in post-CMP cleaning processes. Adhesion forces, which can be a combination of bonding forces such as long range van der Waals forces, chemical or hydrogen bonds, and electrostatic forces, are responsible for the adhesion of particles on the surface of the wafer. There is a need for post-CMP cleaning methods that are capable of overcoming these forces.

Additionally, tendency of Cu to diffuse into underlying substrates such as silicon makes the use of diffusion barrier materials, such as tantalum (Ta)- and tungsten (W)-based diffusion barrier materials, a necessity. Effective CMP of Cu structures requires removal of both the Cu and barrier layers. Barrier materials are typically more difficult than Cu to planarize using conventional slurries (conventional slurries contain a single type of abrasive), which necessitates tailoring slurries to the characteristics of Cu and the Ta- and W-based barrier materials. After the CMP process, a large quantity of slurry particles, along with pieces of polishing pad, metal contaminants, and diffusion barrier material remaining on the device's surface must be removed. There is a need for effective post-CMP cleaning methods that are independent of the film materials.

The emergence of dual-damascene processing (techniques for the simultaneous formation of a conductive plug in electrical contact with a conductive line) includes developing processes that are highly flexible, including those for CMP and post-CMP cleaning. Dual-damascene processing of copper for the patterning of Cu metal into interconnect structures that also include low-k dielectric materials presents still additional challenges, because of the lower density, inferior mechanical properties, and typically increased organic content of low-k materials.

Post-CMP cleaning has become a challenging cleaning application in semiconductor manufacturing. Effective post-CMP cleaning processes are needed to ensure that the challenges of replacing Al metallization with Cu dual-damascene structures, integrating Cu and low-k materials, along with decreasing device feature sizes, and the transition to 300-mm size wafers, are met. There is a need for effective post-CMP cleaning processes to achieve improved device performance with higher productivity and reduced production costs.

The current post-CMP cleaning practices include non-contact cleaning using megasonic baths and contact cleaning using brush scrubbers. The brush (contact) cleaning methods are based on a direct contact between a brush and the wafer surface. Brush cleaning requires that the wafer surface be mechanically washed or brushed by a commercially available equipment called a scrubber. The scrubber may employ heat or ultrasonic augmentation and typically requires immersion times of two to twenty minutes to achieve complete removal of the CMP residue from the wafer surface. While high brush pressure is desirable for the purposes of increasing the contact between the particle and the brush to a point where the adhesion forces can be overcome, high pressure above a certain point can contribute to scratching of the wafer surface by the removed particle. In practice, brush cleaning effectiveness depends on the brush pressure and speed, rate of flow of cleaning solution, and cleaning time. Megasonic (non-contact) cleaning uses high-frequency acoustic pressure waves to remove particles from the wafer surface. Megasonic cleaning effectiveness depends on the megasonic intensity, solution temperature, chemistry, and cleaning time.

It is well known that particulate surface contamination of semiconductor wafers after the CMP process degrades device performance and affects yield in the industry. Additionally, it is well known that the cost of manufacturing a semiconductor is proportional to the time employed for each processing step. It would be advantageous to be able to remove the CMP residue and contaminants without using the mechanical washing or brushing employed by the scrubber in order to reduce an amount of the defects and the scratches. Further, it would be advantageous to more effectively remove the CMP residue and contaminants from the surface features on the wafer surface.

What is needed is an effective post-CMP cleaning method to remove the CMP process residue and contaminants that does not use the mechanical washing, brushing or megasonic baths.

What is further needed is a method of removing the CMP residue and contaminants from the surface features that is more effective than the current post-CMP cleaning methods including mechanical washing, brushing, or megasonic cleaning.

What is additionally needed is a post-CMP cleaning method to achieve improved device performance with higher productivity and reduced production costs.

SUMMARY OF THE INVENTION

One embodiment of the present invention is for a method of removing CMP residue from a surface of a semiconductor substrate. The semiconductor substrate, including the CMP residue on the surface, is placed within a pressure chamber. The pressure chamber is then pressurized. Supercritical carbon dioxide and a solvent are introduced into the pressure chamber. The supercritical carbon dioxide and the solvent are maintained in contact with the semiconductor substrate until the CMP residue is removed from the semiconductor substrate. The pressure chamber is then flushed and vented.

A second embodiment of the invention is for a method of post chemical mechanical polishing (CMP) cleaning to remove a CMP residue from a surface of an object. The object is placed the within a pressure chamber. The pressure chamber is pressurized. A supercritical carbon dioxide process is performed to remove a residual CMP residue from the surface of the object. The pressure chamber is vented.

A third embodiment of the invention is for a method of post-CMP cleaning to remove a CMP residue from a surface of an object. The object is placed the within a pressure chamber. The pressure chamber is pressurized. A liquid carbon dioxide process is performed to remove a residual CMP residue from the surface of the object. The pressure chamber is vented.

DETAILED DESCRIPTION OF THE PREFERRED EMBODIMENT

The present invention utilizes high solvency and cleaning characteristics of supercritical carbon dioxide to assist in a post-CMP cleaning process. In the preferred embodiment, a small amount of a chemical, i.e., a solvent or a solvent mixture, is added to affect the post-CMP cleaning process as compared to the prior art. In the present invention, the supercritical carbon dioxide carries a small amount of the chemical to a wafer surface to be cleaned and is then recycled back for reuse.

The chemical is soluble or insoluble in carbon dioxide and is not damaging to semiconductor device materials. The high solvency and solubilizing ability of the supercritical carbon dioxide makes this method fast, safe, and very quick. High turbulence at wafer surface features in conjunction with hyper-efficient mass transport of a chemical co-solvent package can clean the wafer surface. CMP residue of CMP chemicals and abrasive particles is effectively removed without direct mechanical contact, in contrast to current methods. Another advantage of the present invention is that the wafer surface contains fewer defects as compared to mechanical scrubber methods.

The solvency of supercritical carbon dioxide increases with pressure. Diffusivity and viscosity at or above a critical point of carbon dioxide remains similar to that of a gas phase. Because density above the critical point of the carbon dioxide is nearly equal to that of a liquid state, the supercritical carbon dioxide carries the chemical onto the wafer surface and cleans sub-micron surface features of a modern semiconductor device. In the present invention, the supercritical carbon dioxide also functions to carry away the CMP residue, including the CMP chemicals and abrasive particles, from the sub-micron surface features of the modern semiconductor device. Thus, a small amount of the chemical mixed with the supercritical carbon dioxide performs the post-CMP cleaning process and also cleans away any remaining unwanted chemicals and the CMP residue.

Figure 1:
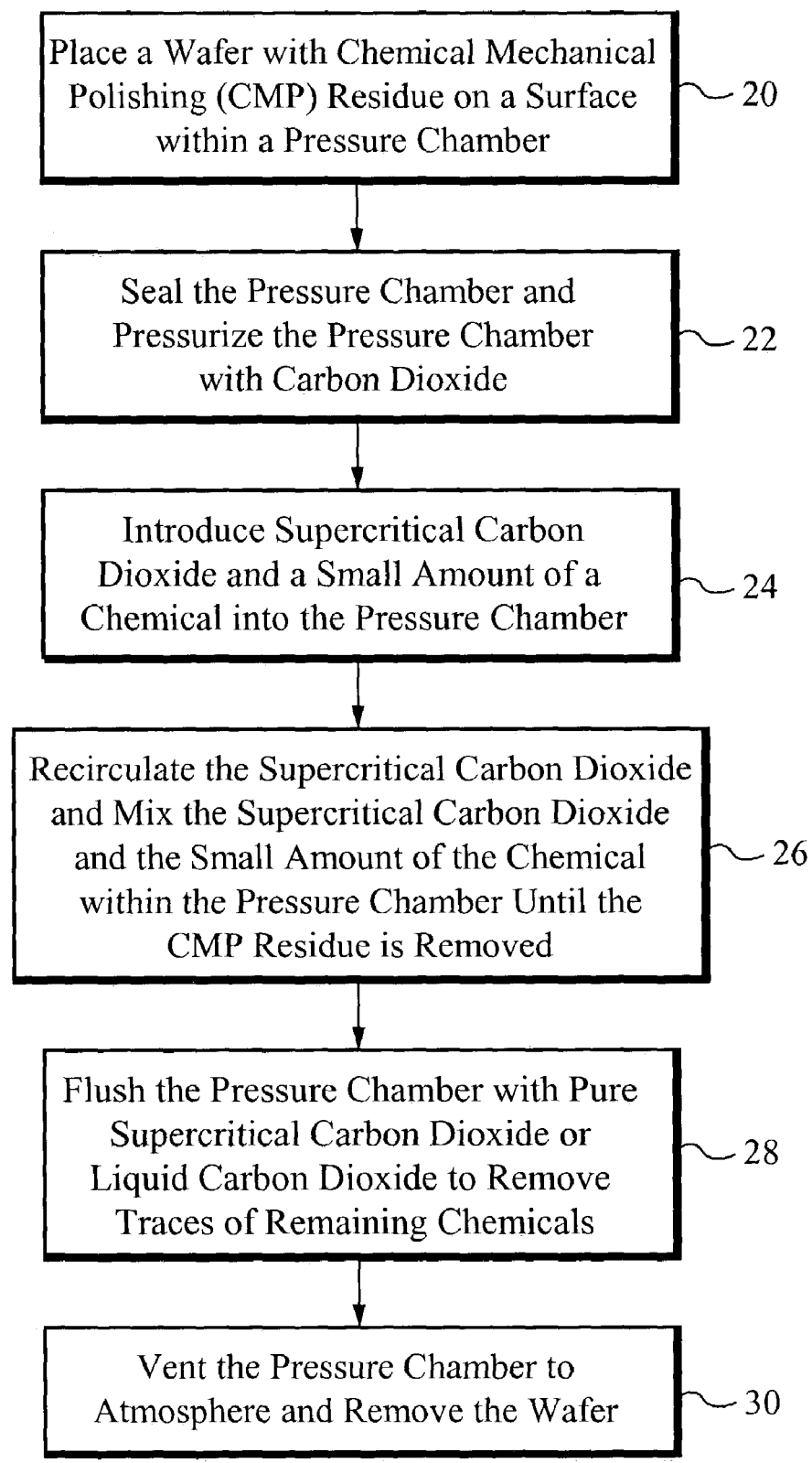
FIG. 1 is a flow chart illustrating the steps of a method of the present invention.

One embodiment of the post-CMP cleaning process of the present invention is illustrated in FIG. 1. The semiconductor wafer including the CMP residue is placed in a pressure chamber in a first process step 20. The pressure chamber is then sealed and pressurized with the carbon dioxide, in a second process step 22. As the pressure inside the pressure chamber builds, the carbon dioxide reaches supercritical temperature and pressure. Typical conditions for this process range from 20° C. to 150° C. and 1050 and 6000 psig. When the desired conditions are reached, a small amount of the chemical is introduced into a supercritical carbon dioxide stream and thus added into the pressure chamber to begin cleaning, in a third process step 24. Typical types and amounts of chemicals are:

a. 0.01–15.0 v/v % of isopropyl alcohol and related alcohols;
b. 0.01–15.0 v/v % of propylene carbonate and related carbonates;
c. 0.01–15.0 v/v % of ethylene glycol and related glycols;
d. 0.001–5.0 v/v % of ozone;
e. 0.01–15.0 v/v % of hydrogen fluoride and related fluorides;
f. 0.01–15.0 v/v % of ammonium hydroxide and related hydroxides;
g. 0.01–15.0 v/v % of citric acid and related acids;
h. 0.01–15.0 v/v % of anionic surfactants;
i. 0.01–15.0 v/v % of cationic surfactants;
j. 0.01–15.0 v/v % of nonionic surfactants; and
k. 0.01–15.0 v/v % of a mixture of any of the above chemicals.

The chemical is preferably selected from a preferred group including the isopropyl alcohol, the propylene carbonate, the ethylene glycol, the ozone, the hydrogen fluoride, the ammonium hydroxide, and the citric acid, or a mixture thereof.

The chemical is alternatively selected from an alternative group including the alcohols related to the isopropyl alcohol, the carbonates related to the propylene carbonate, the glycols related to the ethylene glycol, the fluorides related to the hydrogen fluoride, the hydroxides related to the ammonium hydroxide, and the acids related to the citric acid, or a mixture selected from these chemicals and the preferred group.

The post-CMP cleaning process continues with recirculation of the supercritical carbon dioxide and with mixing, i.e., agitating, thereof inside the pressure chamber until the CMP residue is removed, typically from one-half to fifteen minutes, in a fourth process step 26. The pressure chamber is then flushed with pure supercritical carbon dioxide or liquid carbon dioxide to remove all traces of any remaining chemicals, in a fifth process step 28. Finally, the chamber is vented to atmosphere and the wafer is removed, in a sixth process step 30. At this point, an optional rinse in DI (deionized) or ultra pure water may be performed to finish the cleaning process.

The present invention uses the supercritical carbon dioxide in combination with the small amount of a chemical admixture to remove the CMP residue from the surfaces of the semiconductor devices in a post-CMP cleaning system. The post-CMP cleaning system includes a wafer process chamber, a pump, a sensor system, a pressure and flow regulating system, and a recovery chamber. The wafer process chamber holds the semiconductor wafer or semiconductor wafers. The pump is capable of compressing liquid carbon dioxide beyond the critical point. The sensor system measures temperature, pressure and flows. The pressure and flow regulating system connects a carbon dioxide source to the wafer chamber at the desired conditions. The recovery chamber collects solid and liquid material exhausted from the wafer chamber.

The post-CMP cleaning system preferably includes a temperature control system for heating the wafer process chamber.

The post-CMP cleaning system preferably includes a chemical introduction system for adding precise amounts of the chemical into the supercritical carbon dioxide process stream.

The post-CMP cleaning process of the present invention includes the following steps. The wafer is placed in the wafer process chamber. The post-CMP cleaning system is preferably purged with inert gas or the carbon dioxide. Alternatively, the post-CMP cleaning system is not purged. Next, the post-CMP cleaning system is pressurized with the carbon dioxide to achieve supercritical conditions. A desired amount of the chemical is added into the carbon dioxide, which forms chemical laden supercritical carbon dioxide. The chemical-laden supercritical carbon dioxide is contacted with the wafer. The wafer process chamber is preferably flushed using the supercritical carbon dioxide to remove contaminants. Alternatively, the wafer process chamber is flushed using the liquid carbon dioxide. The post CMP cleaning system is then depressurized to allow removal of the wafer.

The post-CMP cleaning process results in the wafer surface having a defect level that is much lower than current cleaning methods, which utilize mechanical contact of the wafer with roller or brush equipment.

The post-CMP cleaning process removes the CMP residue from semiconductors, bare silicon wafers, metallic covered wafers, and memory storage devices. It will be readily apparent to one of ordinary skill in the art that the post-CMP cleaning process removes the CMP residue from other substrates, including other semiconductor substrates, that have been polished or planarized in the CMP process.

The present invention is directed to processes of removing CMP residue and contaminants such as trace metals from semiconductor wafers using supercritical carbon dioxide. The methods in accordance with the present invention utilize the low viscosity and high solvating and solubilizing properties of supercritical carbon dioxide to assist in the cleaning process.

For purposes of the invention, "carbon dioxide" should be understood to refer to carbon dioxide ($CO_2$) employed as a fluid in a liquid, gaseous or supercritical (including near-supercritical) state. "Liquid carbon dioxide" refers to $CO_2$ at vapor-liquid equilibrium conditions. If gaseous $CO_2$ is used, the temperature employed is preferably below 30.5° C. "Supercritical carbon dioxide" refers herein to $CO_2$ at conditions above the critical temperature (30.5° C.) and critical pressure (1070.4 psi). When $CO_2$ is subjected to temperatures and pressures above 30.5° C. and 1070.4 psi, respectively, it is determined to be in the supercritical state. "Near-supercritical carbon dioxide" refers to $CO_2$ within about 85% of absolute critical temperature and critical pressure.

"Cleaning fluid" refers herein to liquid or supercritical carbon dioxide that can, in a preferred embodiment, be provided as a composition. Liquid or supercritical $CO_2$ compositions preferred for use in the methods of the present invention can include supercritical $CO_2$ and a cleaning chemistry such as solvents, co-solvents and/or surfactants. Preferably, the cleaning chemistry enhances the properties of the supercritical $CO_2$ to promote association of the amphiphilic species with the contaminant and to remove the contaminant in the cleaning fluid.

Various objects can be cleaned using the processes of the present invention such as semiconductor wafers, substrates and other flat media requiring low contamination levels. For the purposes of the invention, "cleaning" should be understood to be consistent with its conventional meaning in the art. As used herein, "substrate" includes a wide variety of structures. A substrate can be a single layer of material, such as a silicon wafer, or can include any number of layers. A substrate can comprise various materials, including metals, ceramics, glass, or compositions thereof.

Figure 2:
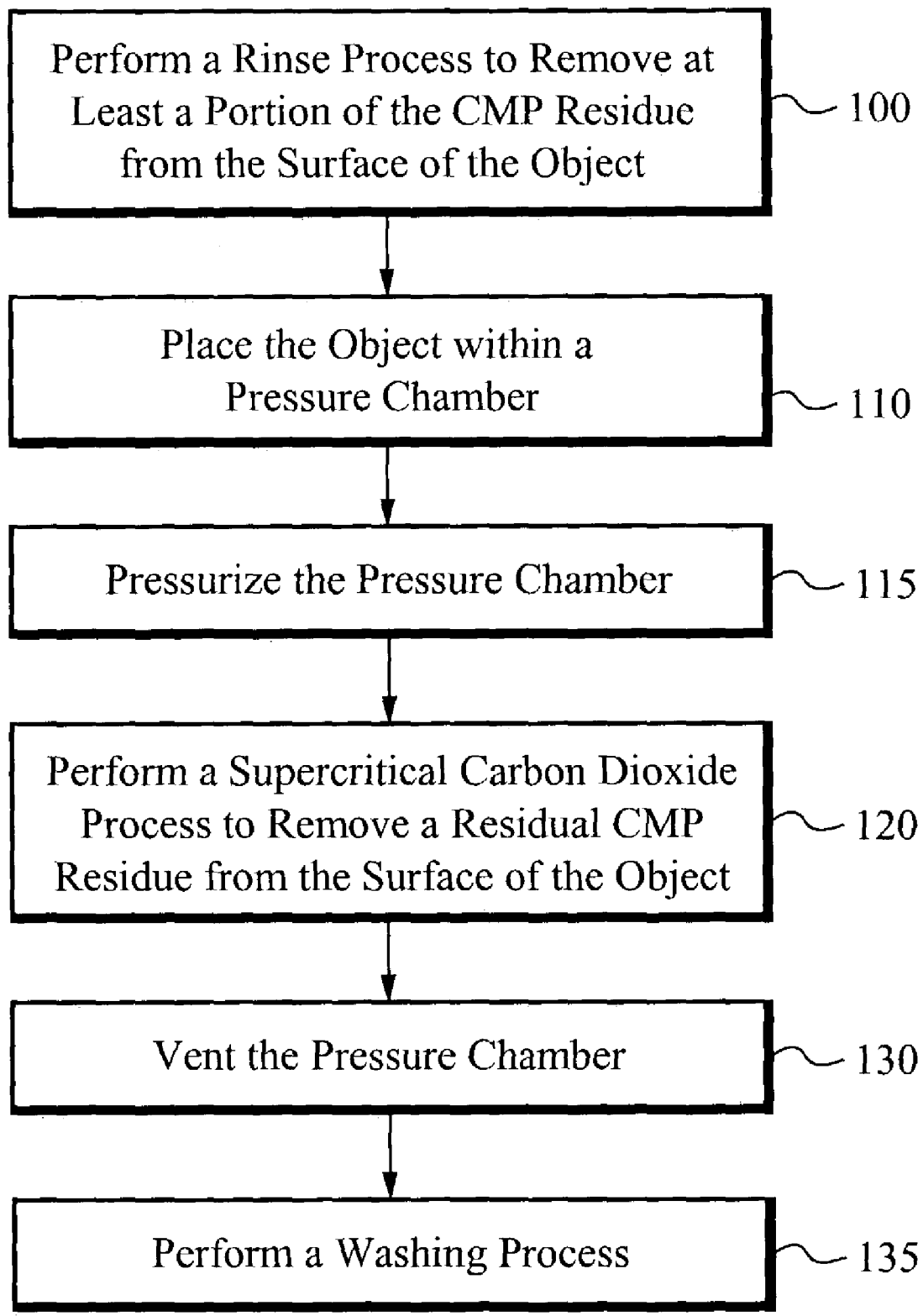
FIG. 2 is a flow chart showing a process flow for a method of post chemical mechanical polishing (CMP) cleaning to remove a CMP residue from a surface of an object in accordance with the present invention.

FIG. 2 is a flow chart showing a process flow for a method of post-CMP cleaning to remove a CMP residue from a surface of an object in accordance with the present invention. In one embodiment of the invention, a rinse process is performed to remove at least a portion of the CMP residue from the surface of the object (100), such as a water rinse. The object is placed within a pressure chamber (110). The pressure chamber is then pressurized (115). Preferably, the pressure chamber is pressurized with gaseous, liquid, supercritical and/or near-supercritical $CO_2$.

In a preferred embodiment of the present invention, a supercritical carbon dioxide process (120) is performed to remove a residual CMP residue from the surface of the object. In one embodiment of the invention, a liquid carbon dioxide process is performed to remove a residual CMP residue from the surface of the object. In a preferred embodiment, in the supercritical $CO_2$ process (120), a cleaning fluid is introduced into the pressure chamber. In one embodiment, the cleaning fluid includes a cleaning chemistry. The pressure chamber is then pressurized with $CO_2$. Preferably, the pressure chamber is pressurized above the $CO_2$ critical pressure (1070.4 psi). In a preferred embodiment, the cleaning fluid is recirculated within the pressure chamber. Preferably, the cleaning fluid is recirculated within the pressure chamber for a period of time to remove a residual CMP residue from the surface of the object.

In one embodiment of the present invention, the CMP residue includes: CMP slurry particles such as silica and alumina, CMP slurry chemicals, CMP polishing pad materials, metal contaminants such as copper metal ions, diffusion barrier materials such as tantalum (Ta)- and tungsten (W)-based diffusion barrier materials (e.g., TaN, TaSiN, WN, WSiN), substrate materials such as $SiO_2$, low-k dielectric materials, or compositions thereof.

In one embodiment of the invention, the CMP residue includes slurry particles and/or slurry chemicals, and the cleaning chemistry comprises benzotriazole (BTA).

In one embodiment of the invention, the CMP residue includes polishing pad materials. In this embodiment, the cleaning chemistry comprises acetone, methyl isobutyl ketone (MIK), dimethyl sulfoxide (DMSO), dimethylacetamide (DMAc), ozone, hydrogen peroxide, or ammonium persulfate.

In one embodiment, the CMP residue includes copper contaminants. In this embodiment of the invention, the cleaning chemistry comprises hexafluoroacetyl acetonate (HFAC), tetramethylheptane dionate (THD), cyclo octa diene (COD), ethylenediaminetetraacetatothulate (TmEDTA), nitrilotriacetate (NTA), pentamethyldiethylenetriamine (PMDETA), nitric acid, or acetylacetonate (ACAC).

In one embodiment, the CMP residue includes tantalum-based materials, and the cleaning chemistry comprises ferro cyanide or hexafluoroacetyl acetonate (HFAC).

In one embodiment, the CMP residue includes $SiO_2$, $F—SiO_2$, $C—SiO_2$, LKD, hydrogen silsequioxane (HSQ), and/or methyl silsequioxane (MSQ). In this embodiment, the cleaning chemistry comprises HF, ammonium fluoride, or quad fluoride.

In one embodiment, the CMP residue includes FLARE™, SiLK™, organic polymers, and/or polymer-based low-k dielectric materials. In this embodiment of the invention, the cleaning chemistry comprises a surfactant.

In one embodiment, the CMP residue includes tungsten-based materials, and the cleaning chemistry comprises potassium ferro cyanide, hydrogen peroxide, or perchloic acid (PCA).

As shown in FIG. 2, in one embodiment of the present invention, the pressure chamber is vented (130). In one embodiment, after venting the pressure chamber (130), a washing process (135) including immersion baths, megasonic baths, mechanical rollers, mechanical brush scrubbers and/or double-sided scrubbers is carried out.

Figure 3:
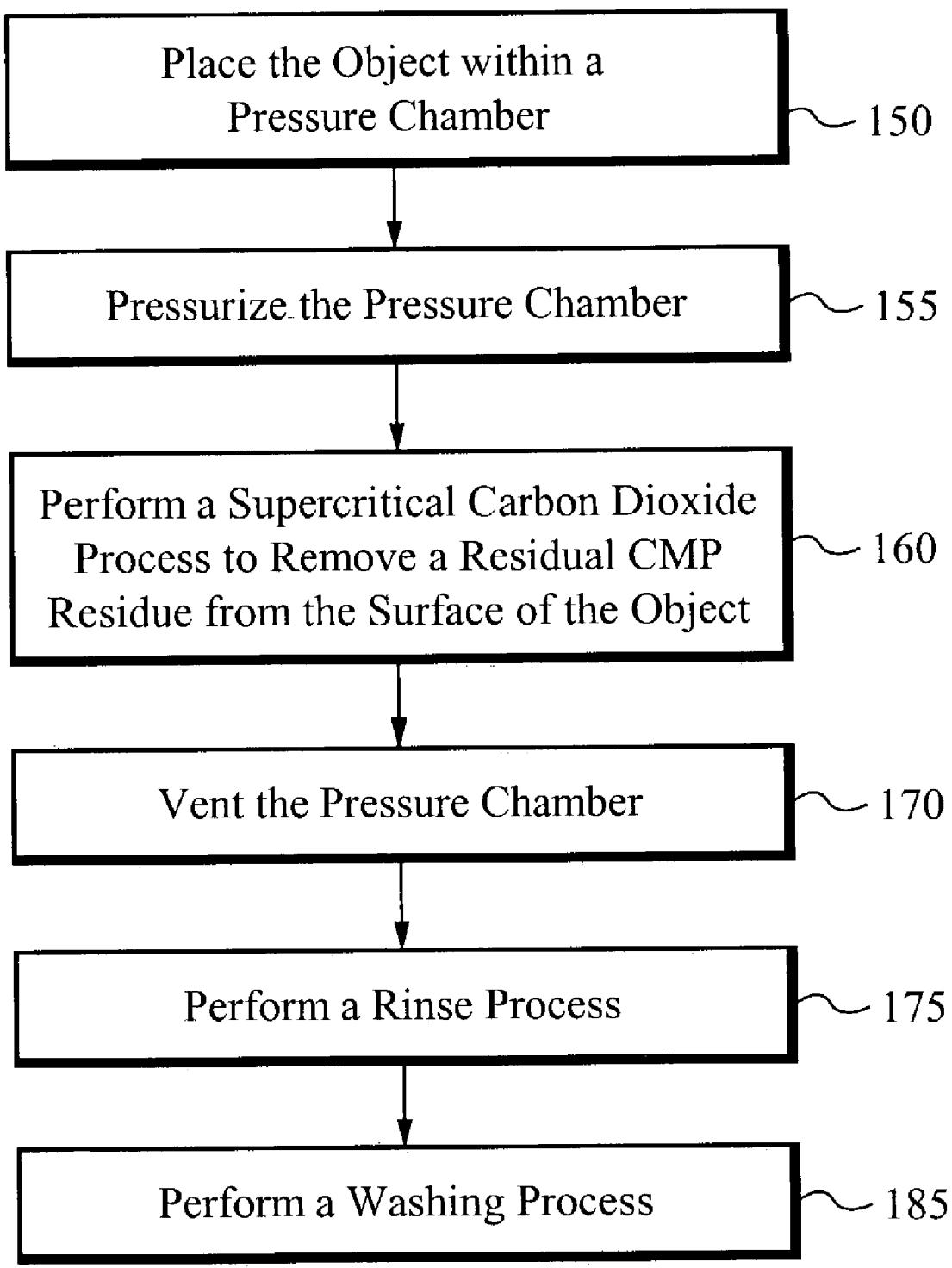
FIG. 3 is a flow chart showing a process flow for a method of post-CMP cleaning to remove a CMP residue from a surface of an object in accordance with the present invention.

FIG. 3 is a flow chart showing a process flow for a method of post-CMP cleaning to remove a CMP residue from a surface of an object in accordance with the present invention. The object is placed within a pressure chamber (150). The pressure chamber is then pressurized (155). Preferably, the pressure chamber is pressurized with gaseous, liquid, supercritical and/or near-supercritical $CO_2$. A supercritical carbon dioxide process (160) is performed to remove a residual CMP residue from the surface of the object. The pressure chamber is vented (170).

In one embodiment of the invention, after venting the pressure chamber (170), a rinse process (175) including immersion baths, megasonic baths, mechanical rollers, mechanical brush scrubbers and/or double-sided scrubbers is carried out.

In one embodiment, after the rinse process (175), a washing process (185) including immersion baths, megasonic baths, mechanical rollers, mechanical brush scrubbers and/or double-sided scrubbers is performed.

While the processes of this invention have been described in detail for the purpose of illustration, the inventive processes are not to be construed as limited thereby. It will be readily apparent to those of reasonable skill in the art that various modifications to the foregoing preferred embodiments can be made without departing from the spirit and scope of the invention as defined by the appended claims.

What is claimed is:

1. A method of post chemical mechanical polishing (CMP) cleaning to remove a CMP residue from a surface of an object comprising the steps of:
   a. performing a rinse process to remove at least a portion of the CMP residue from the surface of the object;
   b. placing the object within a pressure chamber;
   c. pressurizing the pressure chamber;
   d. performing a supercritical carbon dioxide process to remove a residual CMP residue from the surface of the object, wherein performing a supercritical carbon dioxide process comprises:
      i. introducing a cleaning fluid;
      ii. pressurizing the pressure chamber with carbon dioxide such that the pressure chamber is at least at a supercritical pressure; and
      iii. recirculating the cleaning fluid within the pressure chamber;

e. venting the pressure chamber; and f. performing a washing process including at least one of immersion baths, megasonic baths, mechanical rollers, mechanical brush scrubbers and double-sided scrubbers, after the step of venting the pressure chamber.

2. The method of claim 1 wherein the object is a semiconductor wafer for forming integrated circuits.

3. The method of claim 1 wherein the CMP residue comprises at least one of slurry particles, slurry chemicals, polishing pad materials, metal contaminants, diffusion barrier materials, substrate materials, and low-k dielectric materials.

4. The method of claim 1 wherein the step of pressurizing the pressure chamber comprises pressurizing the pressure chamber with at least one of gaseous, liquid, supercritical and near-supercritical carbon dioxide.

5. The method of claim 1 wherein recirculating the cleaning fluid within the pressure chamber comprises recirculating the cleaning fluid within the pressure chamber for a period of time to remove a residual CMP residue from the surface of the object.

6. The method of claim 1 further comprising performing a rinse process, after the step of venting the pressure chamber.

7. The method of claim 6 further comprising performing a washing process including at least one of immersion baths, megasonic baths, mechanical rollers, mechanical brush scrubbers and double-sided scrubbers, after performing the rinse process.

8. The method of claim 1 wherein the cleaning fluid comprises a cleaning chemistry.

9. The method of claim 8 wherein the cleaning chemistry comprises at least one of solvents, co-solvents, anionic, cationic and nonionic surfactants.

10. The method of claim 8 wherein the residual CMP residue includes at least one of slurry particles and slurry chemicals, and wherein the cleaning chemistry comprises benzotriazole (BTA).

11. The method of claim 8 wherein the residual CMP residue includes polishing pad materials, and wherein the cleaning chemistry comprises a material selected from the group consisting of acetone, methyl isobutyl ketone (MIX), dimethyl sulfoxide (DMSO), dimethylacetamide (DMAc), ozone, hydrogen peroxide, and ammonium persulfate.

12. The method of claim 8 wherein the residual CMP residue includes copper contaminants, and wherein the cleaning chemistry comprises a material selected from the group consisting of hexafluoroacetyl acetonate (HFAC), tetramethylheptane dionate (THD), cyclo octa diene (COD), ethylenediaminetetraacetatothulate (TmEDTA), nitrilotriacetate (NTA), pentamethyldiethylenetriamine (PMDETA), nitric acid, and acetylacetonate (ACAC).

13. The method of claim 8 wherein the residual CMP residue includes tantalum-based materials, and wherein the cleaning chemistry comprises a material selected from the group consisting of ferro cyanide and hexafluoroacetyl acetonate (HFAC).

14. The method of claim 8 wherein the residual CMP residue includes at least one of $SiO_2$, $F-SiO_2$, $C-SiO_2$, LKD, hydrogen silsequioxane (HSQ), and methyl silsequioxane (MSQ), and wherein the cleaning chemistry comprises a material selected from the group consisting of HF, ammonium fluoride, and quad fluoride.

15. The method of claim 8 wherein the residual CMP residue includes at least one of organic polymers, and polymer-based low-k dielectric materials, and wherein the cleaning chemistry comprises a surfactant.

16. The method of claim 8 wherein the residual CMP residue includes tungsten-based materials, and wherein the cleaning chemistry comprises a material selected from the group consisting of potassium ferro cyanide, hydrogen peroxide, and perchloic acid (PCA).

17. A method of post chemical mechanical polishing (CMP) cleaning to remove a CMP residue from a surface of an object comprising the steps of:

a. placing the object within a pressure chamber;

b. pressurizing the pressure chamber;

c. performing a liquid carbon dioxide process to remove a residual CMP residue from the surface of the object, wherein performing a liquid carbon dioxide process to remove a residual CMP residue from the surface of the object comprises:

i. introducing a cleaning fluid;

ii. pressurizing the pressure chamber with carbon dioxide; and iii. recirculating the cleaning fluid within the pressure chamber;

d. venting the pressure chamber; and e. performing a rinse process, after the step of venting the pressure chamber.

18. The method of claim 17 further comprising after a CMP operation and before the step of placing the object within the pressure chamber, performing a rinse process to remove at least a portion of the CMP residue from the surface of the object.

19. The method of claim 18 further comprising performing a washing process including at least one of immersion baths, megasonic baths, mechanical rollers, mechanical brush scrubbers and double-sided scrubbers, after the step of venting the pressure chamber.

20. The method of claim 17 further comprising performing a washing process including at least one of immersion baths, megasonic baths, mechanical rollers, mechanical brush scrubbers and double-sided scrubbers, after performing the rinse process.

* * * * *